United States Patent

Gordy et al.

[11] 4,334,193
[45] Jun. 8, 1982

[54] CELL TESTER FOR USE WITH MICROPROCESSOR

[75] Inventors: Lester A. Gordy; David A. Poff, both of Gainesville, Fla.

[73] Assignee: General Electric Company, Gainesville, Fla.

[21] Appl. No.: 133,802

[22] Filed: Mar. 25, 1980

[51] Int. Cl.³ .............................................. G01N 27/42
[52] U.S. Cl. ..................................... 324/437; 324/426
[58] Field of Search ..................... 324/426, 437; 429/90

[56] References Cited

U.S. PATENT DOCUMENTS 2,833,984 5/1958 Eickhoff .............................. 324/437
4,204,161 5/1980 Strickland ........................... 324/426
4,214,204 7/1980 Eberle ................................. 324/437

Primary Examiner—Michael J. Tokar
Attorney, Agent, or Firm—Morgan, Finnegan, Pine, Foley & Lee

[57] ABSTRACT

A tester of electrochemical storage cells includes a pair of arms arranged for pivoting as jaws, each arm terminating in one member in each of two pairs of Kelvin contacts. A stationary member between the arms terminates in the second members of the pairs of Kelvin contacts. In response to the activation of an electrical circuit by a switch sensitive to the presence of the cell, the jaws are urged together to grip the terminals of the cell while maintaining a precise alignment of the Kelvin contacts. Thereby a test circuit is connected to the cell.

12 Claims, 3 Drawing Figures

CELL TESTER FOR USE WITH MICROPROCESSOR

BACKGROUND OF THE INVENTION

This invention relates to the testing of electrochemical storage cells and, more particularly, to a tester having Kelvin contacts which may be automatically secured to the terminals of a cell upon command of a microprocessor.

Electrochemical storage cells or batteries, the term battery applying both to a single cell as well as to a plurality of interconnected cells, are manufactured in large numbers for use in numerous applications in which they serve as the source of electrical power for such diverse items as radios and computers. To insure the reliable operation of such cells, it is the practice among manufacturers of the cells to test the cells before the shipping of the cells to the consumer. In order to facilitate the manufacturing operation, the cells are advantageously tested on the production line in a procedure which involves a minimal amount of time by personnel on the production line.

A problem arises in that the testing of the cells involves both the presence of a high current in the battery terminals and the contacts of the test equipment during one of the tests while, in another of the tests, a sensitive voltage measurement is to be made across the cell terminals. In order to accomplish most of these tests, it is the practice to use Kelvin contacts for the connection of the test equipment to the terminals of the cell. The Kelvin contact permits the implementation of both types of tests so as to eliminate the arduous procedure wherein the battery must be reconnected to test equipment for each of the tests. However, heretofore, the use of the Kelvin contacts on the production line has not been as successful as would be desired. Such contacts have been mounted by springs to insure adequate contact pressure on the cell terminals. But the spring mounting of the contacts has resulted in a lack of accuracy in the positioning of the contacts, as well as excessive wearing of the contacts.

SUMMARY OF THE INVENTION

The aforementioned problem is overcome and other advantages are provided by a cell tester having Kelvin contacts wherein a stationary member of the contact is pressed against one side of a battery terminal for the coupling of high current thereto, and wherein a movable member of the contact is pressed against the opposite side of the terminal for the measurement of the cell voltage. The moving member is pivoted on an arm which provides for precise placement of the moving member relative to the cell terminal and relative to the stationary member. The relative positions of the moving and stationary members are readily established by means of a compressed air drive unit operated through a valve which is electrically activated by electrical circuitry such as that found in a computer or microprocessor. In the case of a lead acid battery, the terminals are readily fabricated in the form of tabs which are asymmetrically positioned relative to the center line of the cell. The cell is positioned within an aperture in a housing enclosing the tester, which aperture is coaxial to the cell, but asymmetrically positioned relative to the tabs and the corresponding Kelvin contacts. The asymmetrical relationship provides for a keying of the tester. The keying prevents the inadvertent insertion of the cell into the tester in any position other than the position providing the correct poling of the cell terminals with the contacts of the tester.

BRIEF DESCRIPTION OF THE DRAWINGS

The aforementioned aspects and other features of the invention are explained in the following description taken in connection with the accompanying drawings wherein.

DESCRIPTION OF THE PREFERRED EMBODIMENT

Figure 1:
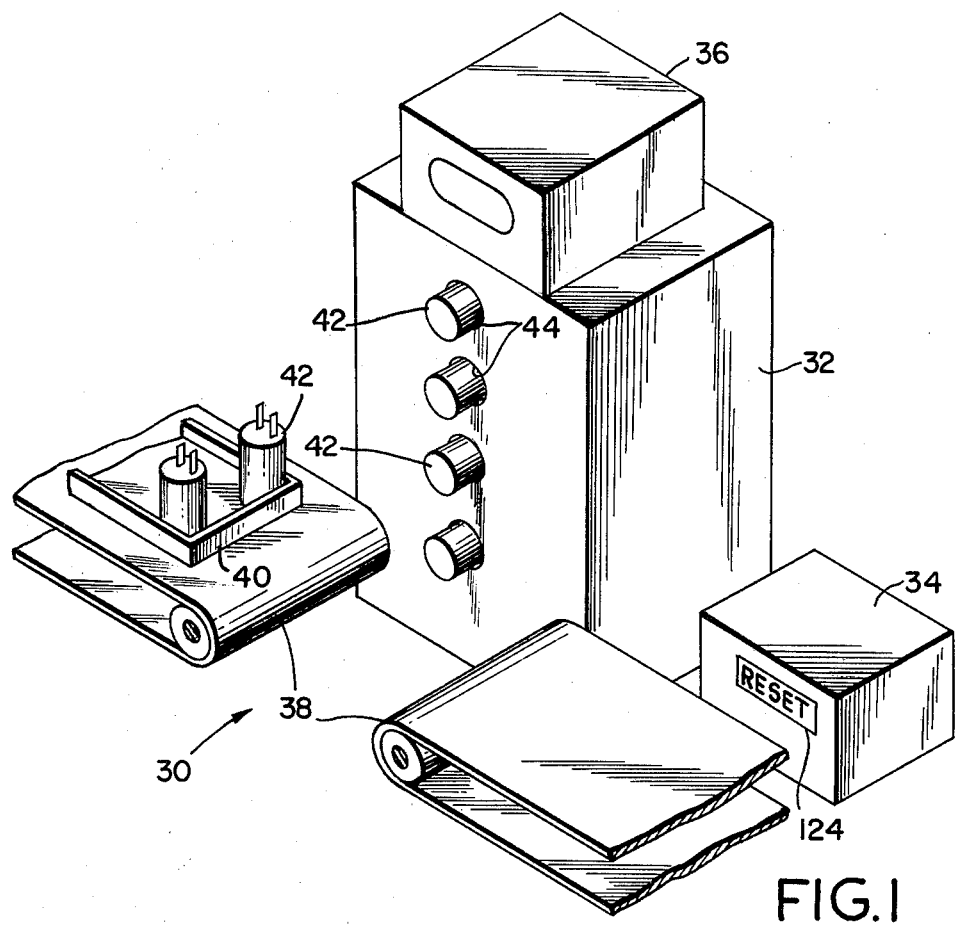
FIG. 1 is a stylized view of test equipment incorporating the invention for the testing of electrochemical cells on the production line.

Referring now to FIG. 1, a test station 30 is fabricated in accordance with the invention and includes a test fixture 32, an electronics unit 34 which houses test circuitry, a display 36, and a conveyor belt 38 which carries trays 40 of electrochemical cells 42 to be tested by the fixture 32. A set of four of these cells 42 is seen positioned along the front face of the fixture 32. These cells 42 are manually positioned by an operator of the station 30 into apertures 44 for making contact via Kelvin contacts, as will be described in FIG. 2, with electronic circuitry, as will be described in FIG. 3. Both the fixture 32 and the display 36 are electrically coupled to the electronic unit 34 whereby the result of the tests can be readily displayed upon the display 36 for observation by an operator of the station 30.

Figure 2:
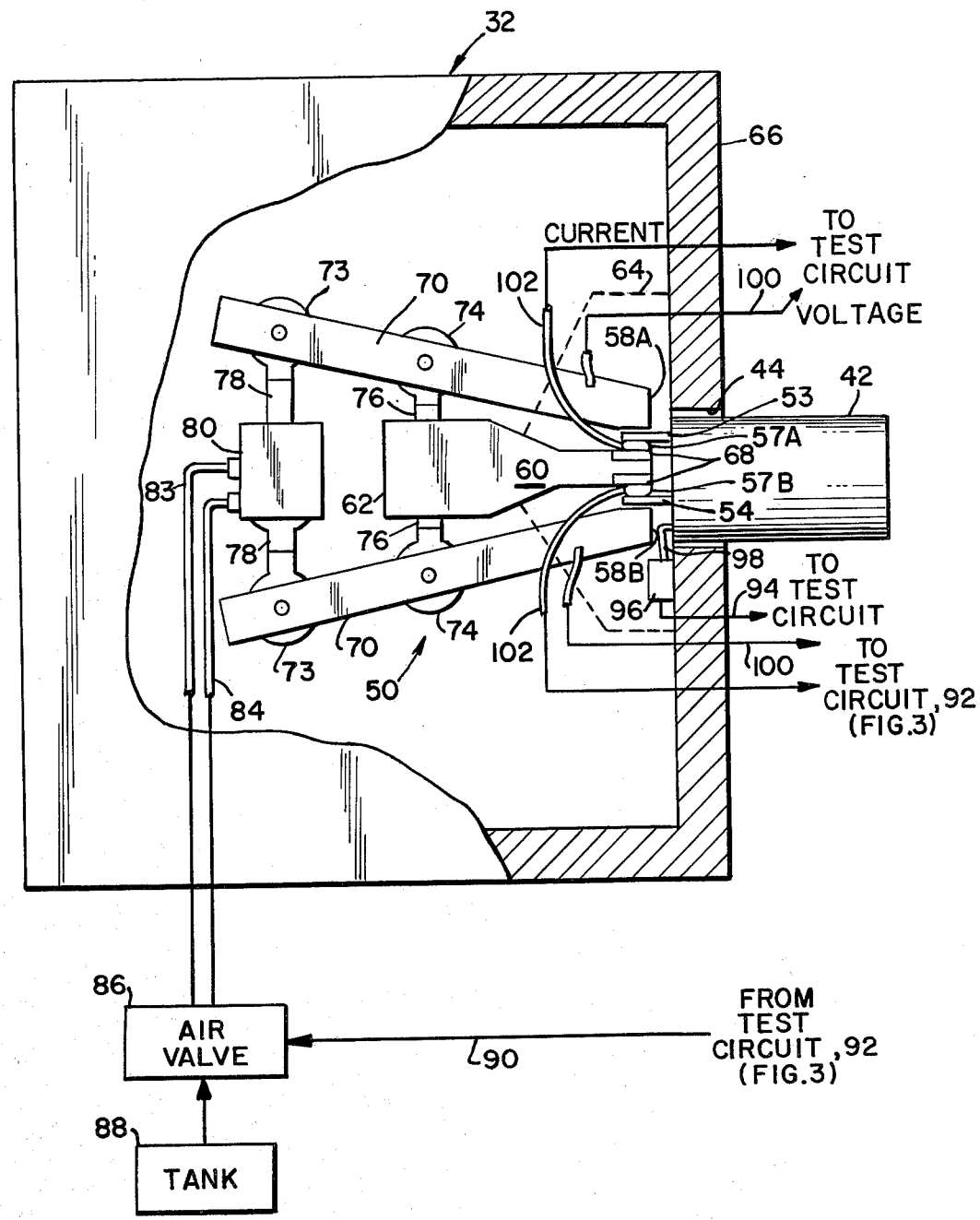
FIG. 2 is an elevation view of a test fixture incorporating the Kelvin contacts of the invention, the test fixture being shown partially cut away to disclose a mechanism for positioning contacts about the terminals of a cell, and wherein portions of the Figure are shown diagrammatically.

Referring now to FIG. 2, the fixture 32 includes a mechanism 50 for positioning Kelvin contacts about tab-shaped terminals 53–54 of one of the cells 42 of FIG. 1 which is positioned within an aperture 44 of the fixture 32. To facilitate the description of the mechanism 50, the fixture 32 of FIG. 2 has been drawn with only one aperture 44 and one mechanism 50, it being understood that there are a total of four such apertures 44 and four such mechanisms 50 in the preferred embodiment of the invention as portrayed in FIG. 1. Each of the Kelvin contacts comprises an inner contact 57 and an outer contact 58, the upper set of contacts 57–58 being further identified by the legend A and the lower set of contacts 57–58 being further identified by the legend B when it is desired to distinguish between the upper contacts 57A and 58A and the lower contacts 57B–58B. The inner contacts 57 are mounted in a stationary position by a tongue 60 of a frame 62, portions of the frame 62 being indicated by dashed lines 64 to show the rigid connection of the frame 62 to a housing 66 of the fixture 32. The tongue 60 is constructed of a metal such as aluminum or steel and, accordingly, the inner contacts 57 are secured to the tongue 60 by electrically insulating shoes 68. The shoes 68 are formed of an electrically insulating material such as polyurethane, nylon or polycarbonate.

The outer contacts 58 are formed integrally with arms 70 of the mechanism 50, the arms 70 being formed of copper as are the outer contacts 58 to provide an electrically conducting path to the terminals 53–54 of the cell 42. The arms 70 pivot in the manner of jaws about pivots 73–74. If desired, shoes (not shown) such as the shoes 68 may be employed at the ends of the arms 70 for insulating the outer contacts 58 from the remaining portions of the arms 70. However, in the preferred embodiment of the invention, it has been found to be advantageous to utilize the aforementioned integral construction of the outer contacts 58 and the arms 70 with insulation of the arms 70 from the remainder of the mechanism 50 being provided by the pivots 73–74 which are constructed of a rigid electrically insulating material such as polyurethane, nylon or polycarbonate. The pivots 74 of the upper and lower arms 70 are supported by legs 76 of the frame 62. The pivots 73 connect with arms 78 of a compressed air cylinder 80, one of the arms 78 being an extension of a piston of the cylinder 80.

The cylinder 80 is of a well-known form providing for the driving of its piston in both the inward and outward directions. Accordingly, two air lines 83, 84, shown partially diagrammatically, are coupled from the cylinder 80 via an air valve 86 to a tank 88 of compressed air. An electric signal on line 90 is provided by a test circuit 92 of FIG. 3 for activating the air valve to provide compressed air alternately along the lines 83–84 to drive the pivots 73 apart or together to pivot the arms 76 for a subsequent engagement or disengagement of the contacts 57–58 with each of the terminals 53–54. As will be seen subsequently with reference to FIG. 3, the test circuit 92 is activated by a signal on line 94 from a switch 96 positioned on the housing 66 adjacent the aperture 44, the switch 96 having an arm 98 which is bent to protrude into the aperture 44 for contacting the top of the cell 42 as it is inserted into the aperture 44.

In the preferred embodiment of the invention, the outer contacts 58 have been utilized for providing electric signals for the measurement of voltage across the terminals 53–54 of the cell 42, the outer contacts 58 being shown coupled to the test circuit 92 by wires 100 which are indicated partially diagrammatically. The inner contacts 57 have been utilized for the measurement of current flowing through the terminals 53–54 of the cells 42, the inner contacts 57 being coupled via wires 102, shown partially diagrammatically, to the test circuit 92. A feature of the Kelvin contact is the employment of one element of the contact, such as the outer contact 58 for the measurement of a voltage, while the other element of the Kelvin contact, the inner contact 57, is utilized for coupling substantially larger amounts of current than is coupled by the outer contact 58.

In accordance with the invention, the use of the arms 70, pivoted by the pivot 74, about the frame 62 provides for a precise alignment and locating of the outer contacts 58 relative to the stationary inner contacts 57. Thereby, sensitive voltage measurements can be made by means of the contacts 58 without interference from large currents flowing through the contacts 57. In addition, it is noted that the cells 42 can be inserted into the fixture 32 without a rubbing and wearing of the Kelvin contacts 57–58, as would occur in a spring-held arrangement of contacts (not shown), since the Kelvin contacts are open at the time of the insertion of the cell 42, and are closed to contact the terminals 53–54 after the cell 42 has been positioned in its requisite location in the aperture 44 of the fixture 32. Also, as seen in FIG. 2, the terminals 53–54 are asymmetrically positioned relative to the central axis of the cell 42 and the aperture 44, the inner contacts 57 being similarly offset with respect to the central axis of the aperture 44. Thus, upon insertion of the cell 42 into the fixture 32, the inner contact 57A can contact the terminal 53 but, in the event of an inadvertent incorrect orientation of the cell 42, would be unable to contact the terminal 54. Similarly, the inner contact 57B can contact only the terminal 54 but could not contact the terminal 53. Thereby, the positioning of the tongue 60 offset from the center of the aperture 44, in combination with the asymmetrical location of the terminals 53–54 provides a keying of the connection between the fixture 32 and the cell 42 so that there is no danger of a reversal of the polarity of the cell 42 which would interfere with the operation of the test circuit 92.

Figure 3:
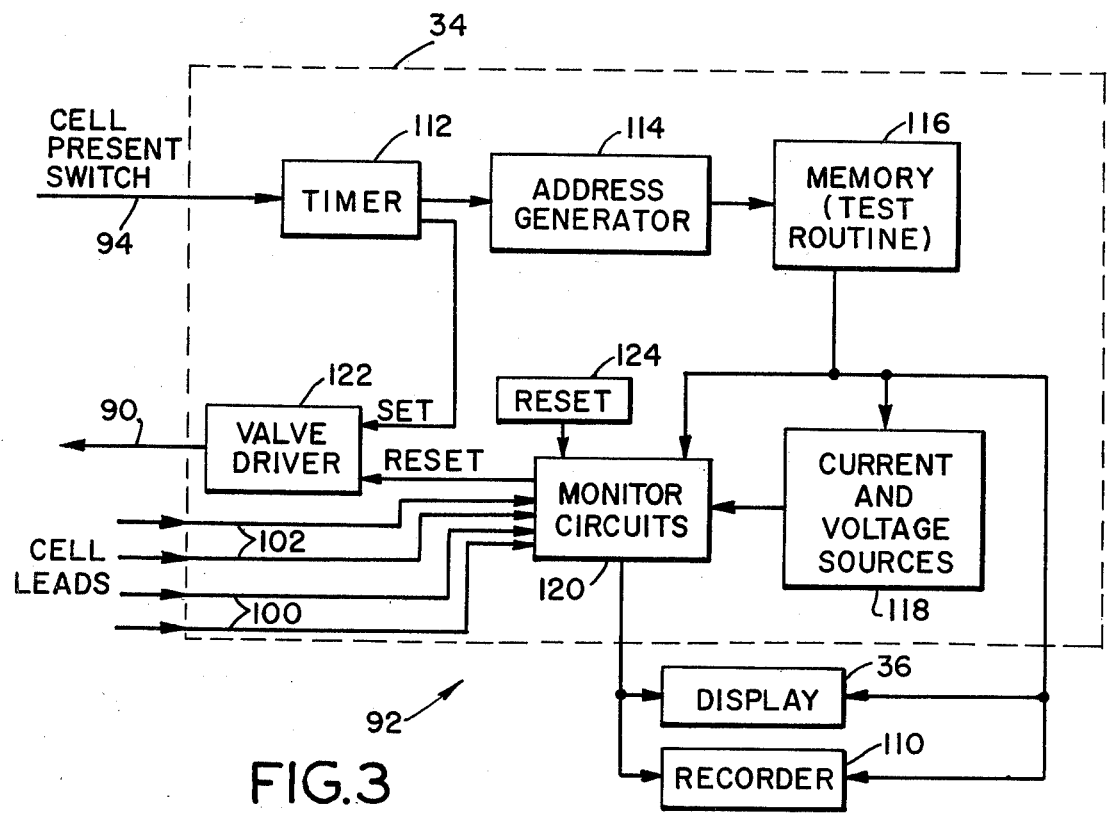
FIG. 3 is a block diagram of an electrical test circuit for operation with the test fixture of FIG. 2.

Referring now to FIG. 3, the test circuit 92 is seen to comprise electrical components within the electronic unit 34, the display 36 which was previously seen in FIG. 1, and an optional recorder 110. The recorder 110 is advantageously utilized for recording the test data of a sequence of cells 42 which have been applied to the station 30 of FIG. 1 for purposes such as the obtaining of statistical data of the test results. The circuit elements within the electronic unit 34 comprise a timer 112, an address generator 114, a memory 116 such as a read-only memory, sources 118 of current and voltage, monitor circuits 120, and a valve driver circuit 122 which may comprise a flip-flop (not shown) to be set and reset for the direction of air pressure along the lines 83 and 84.

In operation, the timer 112 provides timing signals to operate the generator 114, as well as to provide a signal which sets the valve driver circuit 122 to close the jaws of the mechanism 50 and thereby press the inner and outer contacts 57–58 against the respective terminals of the cell 42. The address generator 114, which may include a counter (not shown) as is well known, provides a sequence of addresses to the memory 116. The data stored in the memory 116, upon being addressed by the generator 114, provides signals to the sources 118 and the monitor circuits 120 which designate the appropriate values of current and/or voltage which is to be applied via the Kelvin contacts 57–58 to the cell 42. In addition, the data addressed in the memory 116 signals the monitor circuits 120 of the desired value of current and/or voltage which is to appear at the terminals 53–54 in FIG. 2 in response to the test current and/or test voltage. Thereby, in response to the sequential addressing of the memory 116 by the generator 114, a sequence of tests can be applied to the cell 42 in FIG. 2. The measured values in each of the tests are applied by the monitor circuits 120 to the display 36, the specific test being performed being indicated on the display 36 by a signal coupled from the memory 116 to the display 36. An acceptable value of current and/or voltage in the sequence of tests results in a generation of the reset signal by the monitor circuits 120, the reset signal being applied to the valve driver circuit 122 to open the jaws of the mechanism 50 in FIG. 2 to release the terminals 53–54 of the cell 42.

A feature of the invention is noted in that the reset signal of the monitor circuits 120 is not generated in the event that a cell 42 gives a substandard result in the tests. Thus, the jaws of the mechanism 70 do not open to release the Kelvin contacts from the terminals 53–54. As a result, the person operating the test station 30 of FIG. 1 does not inadvertently remove a defective cell 42 and place it with the cells 42 which have passed the tests. The cell 42 is retained within the fixture 32 until the operator presses a reset button 124 on the monitor circuit 120 to activate the reset signal for releasing the cell 42. The reset button 124 is also seen on the front face of the electronic unit 34 in FIG. 1.

It is also noted that the housing 66 protects the operator from any sparks or heating that are associated with the application of high current between test contacts and battery terminals as may occur when the contacts are dirty or in the event that an operator fails to properly insert the cell, or tries to prematurely extract the cell 42.

It is to be understood that the above-described embodiment of the invention is illustrative only and that modifications thereof may occur to those skilled in the art. Accordingly, it is desired that this invention is not to be limited to the embodiment disclosed herein, but is to be limited only as defined by the appended claims.

What is claimed is:

1. A tester of electrochemical storage cells comprising:
    a housing for supporting a cell for making electrical connections between said cell and a test circuit;
    a mechanism within said housing for bringing electrical contacts in contact with terminals of said cell;
    said electrical contacts having separate wires connected thereto for the measurement of voltage and the application of current to a terminal of said cell; and wherein
    said mechanism comprises a pair of arms pivoting in the manner of jaws to force the members of a Kelvin contact against a terminal of said cell, said mechanism including a stationary frame positioned between said arms, one member in each of a pair of Kelvin contacts being secured to said stationary frame while the other members in said pair of Kelvin contacts are secured to said arms whereby the terminals of said cell can be engaged by a single pivoting of said arms relative to each other.

2. A tester according to claim 1 wherein one member of said Kelvin contact is electrically insulated from said mechanism by an insulating shoe.

3. A tester according to claim 1, wherein said housing has an aperture for admittance of said cell, said aperture being asymmetrically positioned relative to said stationary frame for engagement of a pair of Kelvin contacts supported by said mechanism with asymmetrically positioned terminals of said cell, whereby the connection of said cell to said Kelvin terminals is keyed to prevent a reversing of polarity in said connection.

4. A tester according to claim 3 further comprising a switch secured within said housing for sensing the position of said cell, said switch signaling a circuit of said tester to activate said mechanism for securing said cell within said housing upon the insertion of said cell within said aperture.

5. A tester according to claim 4 wherein said circuit includes reset means coupled to said mechanism for releasing said cell upon a successful completion of a test of said cell, said reset means retaining the engagement of said cell by said mechanism upon an unsuccessful completion of said test.

6. A tester according to claim 5 wherein the end of said cell having said terminals thereon is enclosed by said housing to protect an operator of said tester from electrical currents flowing through terminals of said cell.

7. A tester of an electrochemical cell comprising:
    means for indicating the presence of said cell at said tester;
    jaw means responsive to a signal of said indicating means for grasping terminals of said cell, said jaw means having sets of opposed electrical contacts for contacting separate sides of each of said terminals, said jaw means including a stationary member having electrical contacts thereon for contacting a plurality of said terminals, said opposed contacts in each of said set of contacts being electrically insulated from each other to permit a separate electrical connection of each of said electrical contacts to an electric testing circuit of said tester.

8. A tester according to claim 7 wherein said jaw means comprises a first member and a second member pivotably coupled thereto, said first and said second members positioning opposite ones of said electrical contacts.

9. A tester of an electrochemical cell comprising:
    means for indicating the presence of said cell at said tester;
    jaw means responsive to a signal of said indicating means for grasping terminals of said cell, said jaw means having sets of opposed electrical contacts for contacting separate sides of each of said terminals, said opposed contacts in each of said set of contacts being electrically insulated from each other to permit a separate electrical connection of each of said electrical contacts to an electric testing circuit of said tester;
    said jaw means comprising a first member and a second member pivotably coupled thereto, said first and said second members positioning opposite ones of said electrical contacts; and wherein
    said jaw means include a third member, said first member being stationary and having electrical contacts thereon for contacting a plurality of said terminals, said second and said third members having electrical contacts and pivoting about said first member to contact individual ones, respectively, of said terminals of said cell.

10. A tester having a jaw mechanism adapted to grasp a plurality of battery terminals asymmetrically positioned at one side of a battery comprising:
    an electrical circuit for measuring parameters of said battery;
    said jaw mechanism having jaws for urging electrical contacts upon said terminals for connection with said circuit;
    a housing including means for positioning said battery with said one side offset relative to a center line of said jaws, the offsetting of said jaws relative to said positioning means corresponding to an offset in terminal positions of said battery to provide a keying of said terminals to said electrical contacts.

11. A tester according to claim 10 wherein said housing encloses said battery terminals and said jaws for protection from currents flowing between said terminals and said contacts.

12. A tester according to claim 11 wherein a plurality of said electrical contacts grasp a single one of said terminals, individual ones of said plurality of contacts being separately connected to said circuit.

* * * * *